(12) United States Patent
Hsiao et al.

(10) Patent No.: US 12,476,646 B2
(45) Date of Patent: Nov. 18, 2025

(54) TRI-LEVEL DIGITAL-TO-ANALOG CONVERTER ELEMENT WITH MISMATCH SUPPRESSION AND ASSOCIATED METHOD

(71) Applicant: MEDIATEK INC., Hsin-Chu (TW)

(72) Inventors: Chuan-Hung Hsiao, Hsinchu (TW); Satya Narayana Ganta, Hsinchu (TW); Sung-Han Wen, Hsinchu (TW); Kuan-Ta Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 248 days.

(21) Appl. No.: 18/198,283

(22) Filed: May 16, 2023

(65) Prior Publication Data

US 2023/0412181 A1 Dec. 21, 2023

Related U.S. Application Data

(60) Provisional application No. 63/350,916, filed on Jun. 10, 2022.

(51) Int. Cl.
*H03M 1/06* (2006.01)

(52) U.S. Cl.
CPC .................. *H03M 1/0604* (2013.01)

(58) Field of Classification Search
CPC ......... H03M 1/0604; H03M 1/00; H03M 1/34
USPC .......................................... 341/144, 118, 120
See application file for complete search history.

(56) References Cited

U.S. PATENT DOCUMENTS

| | | | |
|---|---|---|---|
| 6,621,438 B1 | 9/2003 | Hong | |
| 7,551,028 B1* | 6/2009 | Cyrusian | H03F 3/217 |
| | | | 330/10 |
| 9,214,953 B1* | 12/2015 | Mengad | H03M 1/0665 |
| 2011/0102225 A1 | 5/2011 | Liu | |
| 2014/0375488 A1* | 12/2014 | Stoops | H03M 3/50 |
| | | | 341/143 |
| 2015/0002322 A1 | 1/2015 | Bandyopadhyay | |
| 2017/0033802 A1* | 2/2017 | O'Brien | H03M 3/422 |

OTHER PUBLICATIONS

Ma, Companding Techniques for High Dynamic Range Audio CODEC Receiver Path, pp. 1-72, Massachusetts Institute of Technology 2009.

Nguyen, A 108 dB SNR, 1.1 mW Oversampling Audio DAC With A Three-level DEM Technique, IEEE Journal of Solid-State Circuits, vol. 43, No. 12, pp. 2592-2600, Dec. 2008.

(Continued)

*Primary Examiner* — Peguy Jean Pierre
(74) *Attorney, Agent, or Firm* — Winston Hsu

(57) ABSTRACT

A tri-level digital-to-analog converter (DAC) element includes a first DAC cell. The first DAC cell includes a first reference circuit, a second reference circuit, and a switch circuit. The first reference circuit provides a first reference signal. The second reference circuit provides a second reference signal. The first switch circuit receives a control input from an input port of the tri-level DAC element, and controls interconnection between the first reference circuit, the second reference circuit, and an output port of the tri-level DAC element according to the control input. During a period in which the tri-level DAC element operates in a "0" state, the first switch circuit is arranged to couple at least one of the first reference circuit and the second reference circuit to the output port of the tri-level DAC element.

18 Claims, 16 Drawing Sheets

(56) References Cited

OTHER PUBLICATIONS

Rombouts, A Study of Dynamic Element-Matching Techniques for 3-Level Unit Elements, IEEE Transactions on Circuits and Systems—II: Analog and Digital Signal Processing, vol. 47, No. 11, pp. 1177-1187, Nov. 2000.

Cini, Double-Index Averaging: A Novel Technique for Dynamic Element Matching in Sigma-Delta A/D Converters, IEEE Transactions on Circuits and Systems—II: Analog and Digital Signal Processing, vol. 46, No. 4, pp. 353-358, Apr. 1999.

AU, A 1.95-V, 0.34-mW, 12-b Sigma-Delta Modulator Stabilized by Local Feedback Loops, IEEE Journal of Solid-State Circuits, vol. 32, No. 3, pp. 321-328, Mar. 1997.

Ginetti, A CMOS 13-b Cyclic RSD A/D Converter, IEEE Journal of Solid-State Circuits. vol. 27, No. 7. pp. 957-965, Jul. 1992.

Meroni, A 4×40W Digital Input Class-AB Power DAC with 100dB Dynamic Range, ISSCC 2003 / Session 7 DACs and AMPs / Paper 7.3.

* cited by examiner

TRI-LEVEL DIGITAL-TO-ANALOG CONVERTER ELEMENT WITH MISMATCH SUPPRESSION AND ASSOCIATED METHOD

CROSS REFERENCE TO RELATED APPLICATIONS

This application claims the benefit of U.S. Provisional Application No. 63/350,916, filed on Jun. 10, 2022. The content of the application is incorporated herein by reference.

BACKGROUND

The present invention relates to a digital-to-analog conversion technique, and more particularly, to a tri-level digital-to-analog converter (DAC) element with mismatch suppression and an associated method.

Compared to a bi-level DAC element, a tri-level DAC element has certain advantages, including minimum noise contribution from DAC and reference circuit at a low signal level, a reduced DAC cell number for area efficiency, etc. However, in a case where there is no common-mode feedback (CMFB) circuit connected to a transimpedance amplifier, the conventional tri-level DAC element may suffer from non-linear distortion due to static mismatch between two reference circuits such as a P-channel metal-oxide-semiconductor (PMOS) based current source and an N-channel metal-oxide-semiconductor (NMOS) based current sink. In another case where there is a CMFB circuit connected to a transimpedance amplifier to mitigate the non-linear distortion resulting from static mismatch between the reference circuits, the typical tri-level DAC element may suffer from total harmonic distortion (THD) degradation due to drain voltage modulation.

SUMMARY

One of the objectives of the claimed invention is to provide a high-linearity tri-level digital-to-analog converter element with mismatch suppression and an associated method.

According to a first aspect of the present invention, an exemplary tri-level digital-to-analog converter (DAC) element is disclosed. The exemplary tri-level DAC element includes a first DAC cell. The first DAC cell includes a first reference circuit, a second reference circuit, and a first switch circuit. The first reference circuit is arranged to provide a first reference signal. The second reference circuit is arranged to provide a second reference signal. The first switch circuit is coupled to the first reference circuit and the second reference circuit, and arranged to receive a control input from an input port of the tri-level DAC element, and control interconnection between the first reference circuit, the second reference circuit, and an output port of the tri-level DAC element according to the control input, wherein the tri-level DAC element operates in one of three states that correspond to different levels in response to the control input; and during a period in which the tri-level DAC element operates in a "0" state of the three states, the first switch circuit is arranged to couple at least one of the first reference circuit and the second reference circuit to the output port of the tri-level DAC element.

According to a second aspect of the present invention, an exemplary digital-to-analog conversion method is disclosed. The exemplary digital-to-analog conversion method includes: receiving a control input from an input port of a tri-level DAC element, wherein the tri-level DAC element operates in one of three states that correspond to different levels in response to the control input, and comprises: a first reference circuit, arranged to provide a first reference signal, and a second reference circuit, arranged to provide a second reference signal; and in response to the control input, controlling interconnection between the first reference circuit, the second reference circuit, and an output port of the tri-level DAC element, comprising: during a period in which the tri-level DAC element operates in a "0" state of the three states, coupling at least one of the first reference circuit and the second reference circuit to the output port of the tri-level DAC element.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
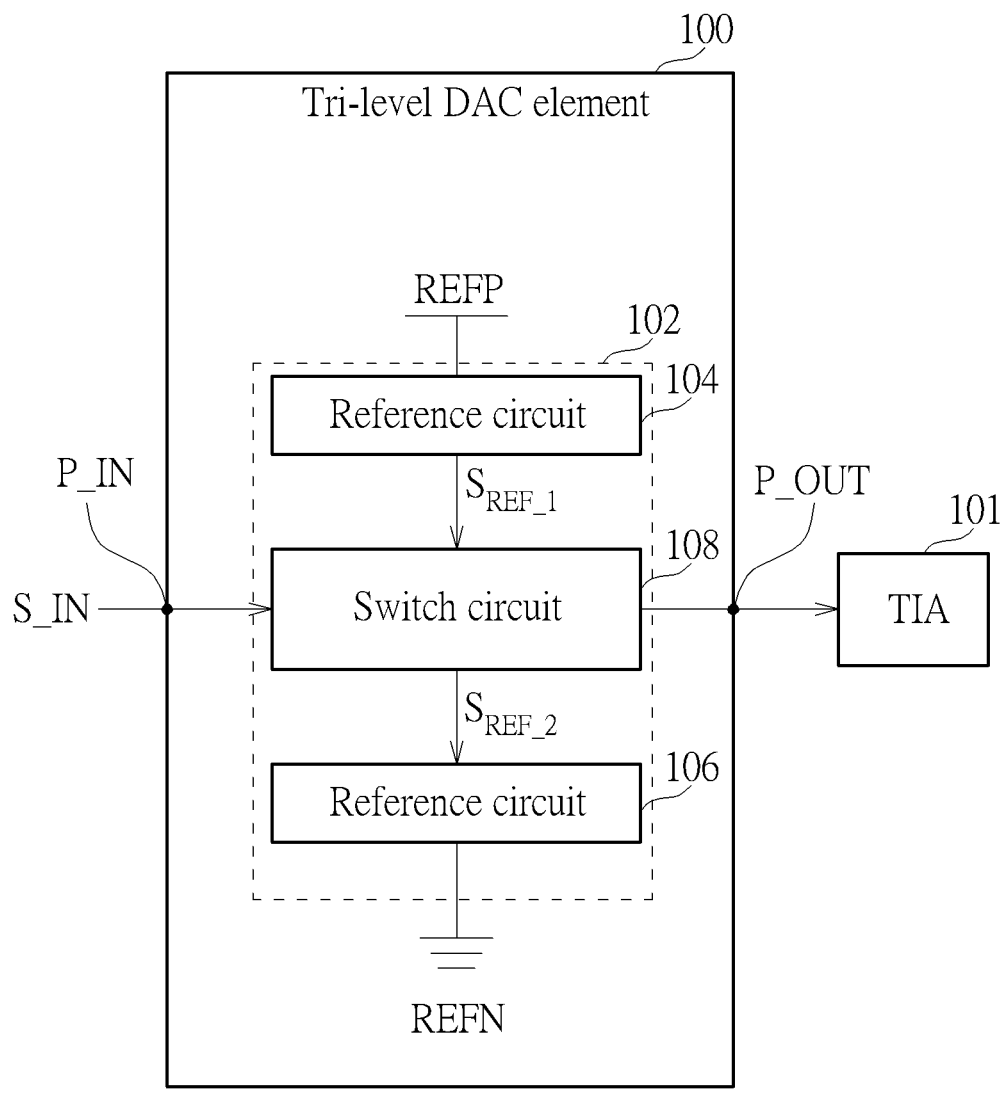
FIG. 1 is a block diagram illustrating a first design of a high-linearity tri-level digital-to-analog converter (DAC) element with mismatch suppression according to an embodiment of the present invention.

FIG. 1 is a block diagram illustrating a first design of a high-linearity tri-level digital-to-analog converter (DAC) element with mismatch suppression according to an embodiment of the present invention. In this embodiment, the tri-level DAC element 100 includes only a single DAC cell 102. The DAC cell 102 includes two reference circuits 104, 106 and a switch circuit 108. The reference circuit 104 is coupled between one reference voltage (e.g., supply voltage) REFP and the switch circuit 108, and is arranged to provide a reference signal $S_{REF\_1}$. The reference circuit 106 is coupled between another reference voltage (e.g., ground voltage) REFN and the switch circuit 108, and is arranged to provide a reference signal $S_{REF\_2}$. For example, the tri-level DAC element 100 is a tri-level current-steering DAC (I-DAC), the reference circuit 104 is a PMOS based current source for generating a reference current $I_p$ as the reference signal $S_{REF\_1}$, and the reference circuit 106 is an NMOS based current sink for generating a reference current $I_n$ as the reference signal $S_{REF\_2}$. The switch circuit 108 is coupled between two reference circuits 104 and 106, and includes a plurality of switches (not shown in FIG. 1) for controlling interconnection between the reference circuits 104, 106 and an output port P_OUT of the tri-level DAC element 100. In a case where the tri-level DAC element 100 is a tri-level I-DAC, the output port P_OUT may be coupled to a transimpedance amplifier (TIA) 101. Specifically, the switch circuit 108 is arranged to receive a control input S_IN from an input port P_IN of the tri-level DAC element 100, and control interconnection between the reference circuits 104, 106 and the output port P_OUT of the tri-level DAC element 100 according to the control input S_IN. For example, the control input S_IN may include control bits P, Z, and N, and the tri-level DAC element 100 operates in one of three states {"+1" state, "0" stage, "−1" state} that correspond to different levels {+1, 0, −1} in response to the control input S_IN={P, Z, N}, as shown in Table 1 below.

TABLE 1

| P | Z | N | Out |
|---|---|---|-----|
| 1 | 0 | 0 | +1 |
| 0 | 1 | 0 | 0 |
| 0 | 0 | 1 | −1 |

In this embodiment, during a period in which the tri-level DAC element 100 operates in a "0" state, the switch circuit 108 is arranged to couple at least one of the reference circuits 104 and 106 to the output port P_OUT of the tri-level DAC element 100. Specifically, none of the reference circuits 104 and 106 is fully disconnected from the output port P_OUT of the tri-level DAC element 100 during the whole period in which the tri-level DAC element 100 operates in the "0" state. Hence, the tri-level DAC element 100 may also be called a pseudo tri-level DAC element. To achieve mismatch suppression, the mismatch between the reference circuits 104 and 106 (particularly, mismatch between reference signals $S_{REF\_1}$ and $S_{REF\_2}$) is intentionally output by the tri-level DAC element 100 in the "0" state.

Figure 2:
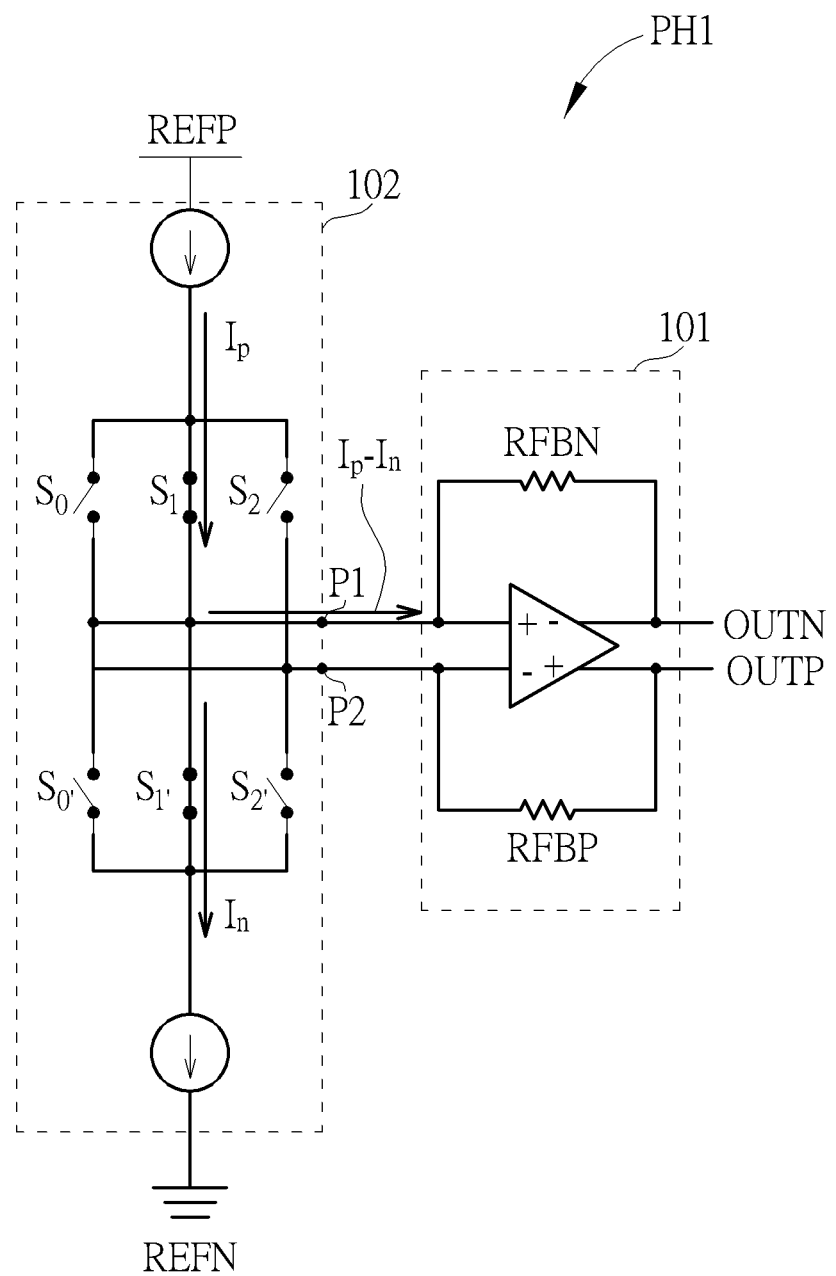
FIG. 2 is a diagram illustrating a configuration of the tri-level DAC element in FIG. 1 that operates under a first phase in a "0" state according to an embodiment of the present invention.
Figure 3:
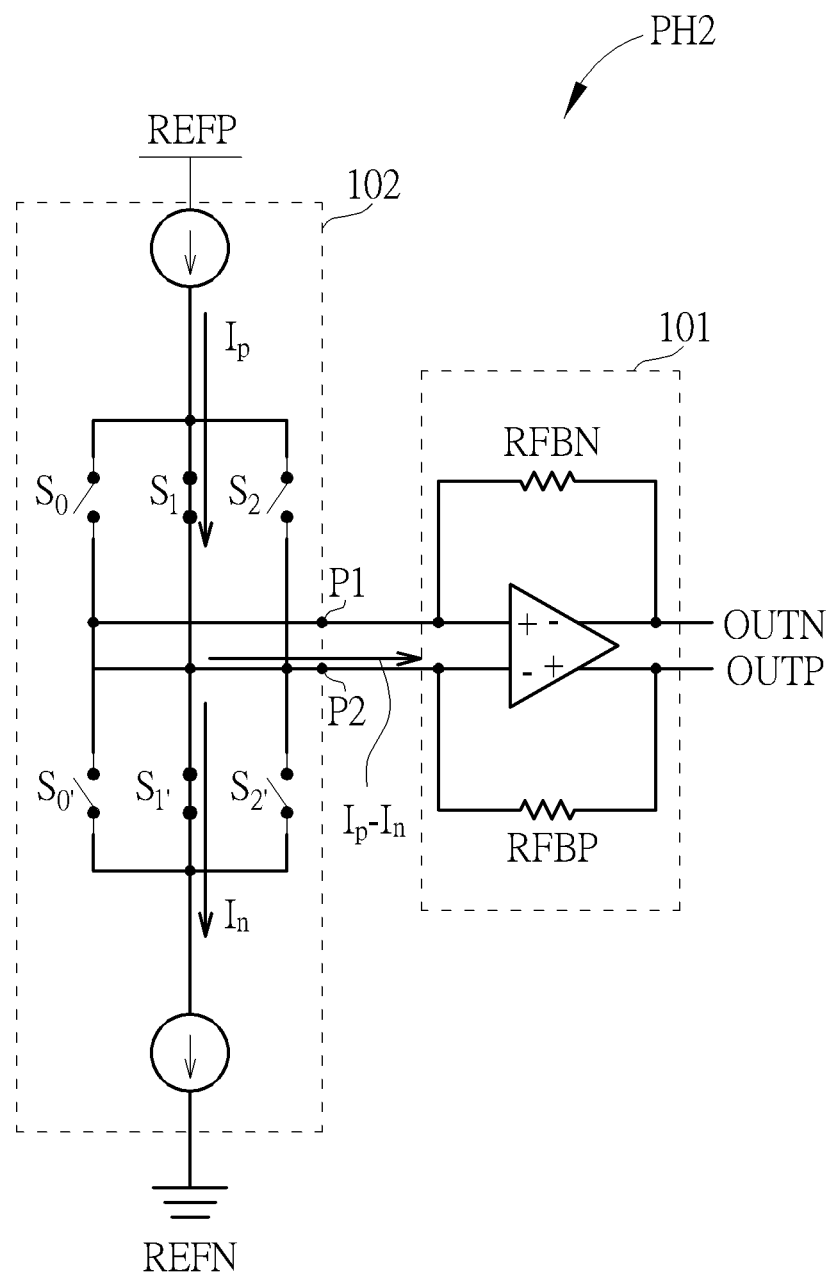
FIG. 3 is a diagram illustrating a configuration of the tri-level DAC element in FIG. 1 that operates under a second phase in a "0" state according to an embodiment of the present invention.

As shown in FIG. 1, the tri-level DAC element 100 includes only a single DAC cell 102. To achieve the objective of suppressing the unwanted effect resulting from mismatch between the reference circuits 104 and 106, a doubled sampling frequency 2*Fs may be used to divide one unit DAC symbol period into a first phase PH1 and a second phase PH2. That is, the period in which the tri-level DAC element 100 operates in the "0" state is divided into the first phase PH1 and the second PH2. Please refer to FIG. 2 and FIG. 3. FIG. 2 is a diagram illustrating a configuration of the tri-level DAC element 100 operating under the first phase PH1 in the "0" state according to an embodiment of the present invention. FIG. 3 is a diagram illustrating a configuration of the tri-level DAC element 100 operating under the second phase PH2 in the "0" state according to an embodiment of the present invention. Suppose that reference circuit 104 is a PMOS based current source for generating the reference current $I_p$ as the reference signal $S_{REF\_1}$, the reference circuit 106 is an NMOS based current sink for generating the reference current $I_n$ as the reference signal $S_{REF\_2}$, and the switch circuit 108 has a plurality of switches such as $S_0, S_1, S_2, S_{0'}, S_{1'}, S_{2'}$. In this embodiment, the output port P_OUT of the tri-level DAC element 100 includes two output nodes P1 and P2, where the output node P1 is coupled to a non-inverting input node (+) of the TIA 101, the output node P2 is coupled to an inverting node (−) of the TIA 101, a differential output (OUTP−OUTN) of the TIA 101 consists of a positive output OUTP and a negative output OUTN, the output node P1 is further coupled to the negative output OUTN of the TIA 101 via one feedback resistor RFBN, and the output node P2 is further coupled to the positive output OUTP of the TIA 101 via another feedback resistor RFBP. For example, the feedback resistors RFBP and RFBN may have the same resistance value $R_F$ (i.e., RFBP=RFBN=$R_F$).

As shown in FIG. 2, when the tri-level DAC element 100 operates in the first phase PH1 in the "0" state, the switch circuit 108 is controlled to couple both of the reference circuits 104 and 106 to the output node P1, and disconnect both of the reference circuits 104 and 106 from the output node P2. As shown in FIG. 3, when the tri-level DAC element 100 operates in the second phase PH2 in the "0" state, the switch circuit 108 is controlled to couple both of the reference circuits 104 and 106 to the output node P2, and disconnect both of the reference circuits 104 and 106 from the output node P1. It should be noted that the order of the first phase PH1 and the second phase PH2 may be adjusted, depending upon actual design considerations. In one exemplary design, the first phase PH1 may precede the second phase PH2. In another exemplary design, the second phase PH2 may precede the first phase PH1.

The positive output OUTP, the negative output OUTN, and the difference between the positive output OUTP and the negative output OUTN generated during the period (which is divided into two phases PH1 and PH2) in which the tri-level DAC element 100 operates in the "0" state may be expressed using the following formulas.

$$\text{OUT}P = V_{cm} - \left(\frac{I_p - I_n}{2}\right) \cdot R_F \quad (1)$$

$$\text{OUT}N = V_{cm} - \left(\frac{I_p - I_n}{2}\right) \cdot R_F \quad (2)$$

$$\text{OUT}P - \text{OUT}N = 0 \quad (3)$$

If the tri-level DAC element (which is a pseudo tri-level DAC element) 100 is replaced with a typical tri-level DAC element, the positive output OUTP, the negative output OUTN, and the difference between the positive output OUTP and the negative output OUTN generated during the period in which the typical tri-level DAC element operates in the "0" state may be expressed using the following formulas.

$$\text{OUT}P = V_{cm} \quad (4)$$

$$\text{OUT}N = V_{cm} \quad (5)$$

$$\text{OUT}P - \text{OUT}N = 0 \quad (6)$$

It should be noted that the positive output OUTP, the negative output OUTN, and the difference between the positive output OUTP and the negative output OUTN generated during a period in which the tri-level DAC element 100 operates in the "+1" state are the same as that generated during a period in which the typical tri-level DAC element operates in the "+1" state, and may be expressed using the following formulas.

$$\text{OUT}P = V_{cm} + I_n \cdot R_F \quad (7)$$

$$\text{OUT}N = V_{cm} - I_p \cdot R_F \quad (8)$$

$$\text{OUT}P - \text{OUT}N = (I_n + I_p) \cdot R_F \quad (9)$$

Furthermore, the positive output OUTP, the negative output OUTN, and the difference between the positive output OUTP and the negative output OUTN generated during a period in which the tri-level DAC element 100 operates in the "−1" state are the same as that generated during a period in which the typical tri-level DAC element operates in the "−1" state, and may be expressed using the following formulas.

$$\text{OUT}P = V_{cm} - I_p \cdot R_F \quad (10)$$

$$\text{OUT}N = V_{cm} + I_n \cdot R_F \quad (11)$$

$$\text{OUT}P - \text{OUT}N = -(I_n + I_p) \cdot R_F \quad (12)$$

Since the present invention is focused on the interconnection between two reference circuits 104, 106 and the output port P_OUT of the tri-level DAC element 100 during a period in which the tri-level DAC element 100 operates in the "0" state, further description directed to operations of the tri-level DAC element 100 in the "+1" state and the "−1" state is omitted here for brevity.

Figure 4:
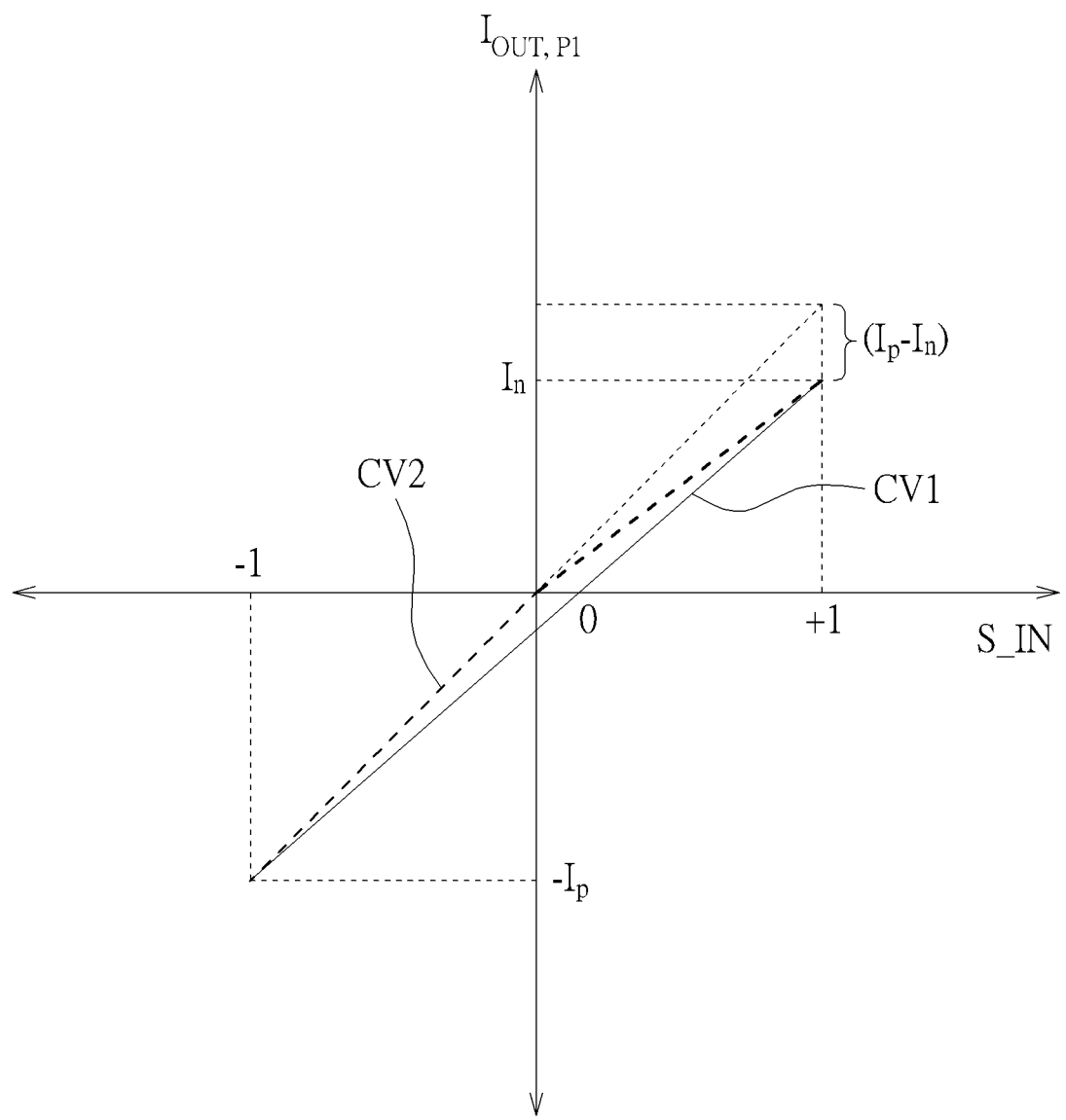
FIG. 4 is a diagram illustrating a transfer curve for one single-ended current output at an output node according to an embodiment of the present invention.

As can be seen from above formulas (3) and (6), the difference between the positive output OUTP and the negative output OUTN generated during the period (which is divided into two phases PH1 and PH2) in which the tri-level DAC element 100 operates in the "0" state is the same as the difference between the positive output OUTP and the negative output OUTN generated during the period in which the typical DAC element operates in the "0" state. However, as can be seen from above formulas (1) and (2), each of the positive output OUTP and the negative output OUTN generated during the period (which is divided into two phases PH1 and PH2) in which the tri-level DAC element 100 operates in the "0" state includes a mismatch term $$\left(\frac{I_p - I_n}{2}\right) \cdot R_F$$

contributed from the reference circuits 104 and 106. In this way, the linearity for both single-ended outputs OUTP and OUTN can be improved. FIG. 4 is a diagram illustrating a transfer curve for one single-ended current output $I_{OUT,P1}$ at the output node P1 according to an embodiment of the present invention. The transfer curve CV1 for the single-ended current output $I_{OUT,P1}$ is obtained by the tri-level DAC element 100 under different settings of the control input S_IN for different levels {+1, 0, −1}. The transfer curve CV2 for the single-ended current output $I_{OUT,P1}$ is obtained by the typical tri-level DAC element under different settings of the control input S_IN for different levels {+1, 0, −1}. Since the mismatch between the reference circuits 104 and 106 (particularly, mismatch between reference signals $S_{REF\_1}$ and $S_{REF\_2}$) is intentionally output by the tri-level DAC element 100 in the "0" state, there is no non-linearity for both single-ended outputs OUTP, OUTN and the differential output (OUTP−OUTN).

By using the DAC element of the present invention, the CMFB gain for a current-to-voltage (I-to-V) buffer can be relaxed, and the voltage fluctuation at the virtual ground of the TIA 101 can be reduced, which results in less drain modulation in the tri-level DAC element 100 (i.e., less intermodulation of DAC).

In the embodiment shown in FIG. 1, the tri-level DAC element 100 includes only a single DAC cell 102 that is responsible for setting the current at the output port P_OUT connected to the next processing stage (e.g., TIA 101), where at least one of the reference circuits 104 and 106 is coupled to the output port P_OUT in the "0" state for mismatch suppression. However, this is for illustrative purposes only, and is not meant to be a limitation of the present invention. The same mismatch suppression effect can be achieved through using more than one DAC cell in the proposed pseudo tri-level DAC element. For example, the single DAC cell 102 may be divided into two half-cells.

Figure 5:
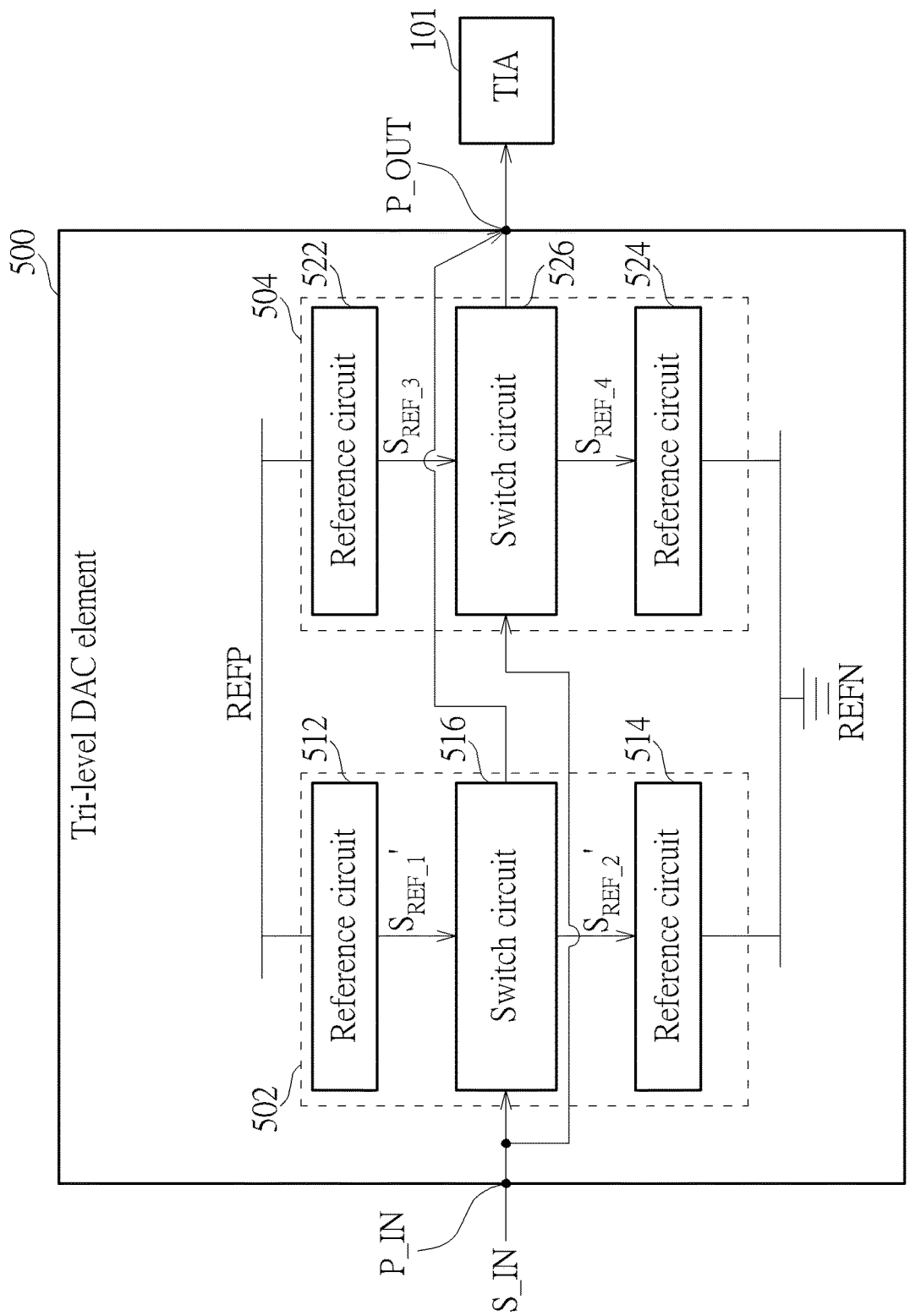
FIG. 5 is a block diagram illustrating a second design of a high-linearity tri-level DAC element with mismatch suppression according to an embodiment of the present invention.

FIG. 5 is a block diagram illustrating a second design of a high-linearity tri-level DAC element with mismatch suppression according to an embodiment of the present invention. In this embodiment, the tri-level DAC element 500 is a pseudo tri-level DAC element including two DAC cells 502 and 504. Regarding the DAC cell 502, it includes two reference circuits 512, 514 and a switch circuit 516. The reference circuit 512 is coupled between one reference voltage (e.g., supply voltage) REFP and the switch circuit 516, and is arranged to provide a reference signal $S_{REF\_1}'$.

The reference circuit 514 is coupled between another reference voltage (e.g., ground voltage) REFN and the switch circuit 516, and is arranged to provide a reference signal $S_{REF\_2}'$. In this embodiment, the reference signal $S_{REF\_1}'$ may be equal to a half of the reference signal $S_{REF\_1}$ shown in FIG. 1, and the reference signal $S_{REF\_2}'$ may be equal to a half of the reference signal $S_{REF\_2}$ shown in FIG. 1. For example, the reference circuit 502 is a PMOS based current source for generating a reference current $I_p/2$ as the reference signal $S_{REF\_1}'$, and the reference circuit 504 is an NMOS based current sink for generating a reference current $I_n/2$ as the reference signal $S_{REF\_2}'$. The switch circuit 516 is coupled between two reference circuits 512 and 514, and includes a plurality of switches (not shown in FIG. 5) for controlling interconnection between the reference circuits 512, 514 and an output port P_OUT of the tri-level DAC element 500.

Regarding the DAC cell 504, it includes two reference circuits 522, 524 and a switch circuit 526. The reference circuit 522 is coupled between the reference voltage (e.g., supply voltage) REFP and the switch circuit 526, and is arranged to provide a reference signal $S_{REF\_3}$. The reference circuit 524 is coupled between another reference voltage (e.g., ground voltage) REFN and the switch circuit 526, and is arranged to provide a reference signal $S_{REF\_4}$. In this embodiment, the reference signal $S_{REF\_3}$ may be equal to a half of the reference signal $S_{REF\_1}$ shown in FIG. 1, and the reference signal $S_{REF\_4}$ may be equal to a half of the reference signal $S_{REF\_2}$ shown in FIG. 1. For example, the reference circuit 522 is a PMOS based current source for generating a reference current $I_p/2$ as the reference signal $S_{REF\_3}$, and the reference circuit 524 is an NMOS based current sink for generating a reference current $I_n/2$ as the reference signal $S_{REF\_4}$. The switch circuit 526 is coupled between two reference circuits 522 and 524, and includes a plurality of switches (not shown in FIG. 5) for controlling interconnection between the reference circuits 522, 524 and the output port P_OUT of the tri-level DAC element 500. In a case where the tri-level DAC element 500 is a tri-level I-DAC, the output port P_OUT may be coupled to the aforementioned TIA 101.

Specifically, the switch circuit 516 is arranged to receive a control input S_IN from an input port P_IN of the tri-level DAC element 500, and control interconnection between the reference circuits 512, 514 and the output port P_OUT of the tri-level DAC element 500 according to the control input S_IN. Similarly, the switch circuit 526 is arranged to receive the control input S_IN from the input port P_IN of the tri-level DAC element 500, and control interconnection between the reference circuits 522, 524 and the output port P_OUT of the tri-level DAC element 500 according to the control input S_IN. For example, the control input S_IN may include control bits P, Z, and N, and the tri-level DAC element 500 operates in one of three states {"+1" state, "0" stage, "−1" state} that correspond to different levels {+1, 0, −1} in response to the control input S_IN={P, Z, N}, as shown in the above Table 1.

In this embodiment, during a period in which the tri-level DAC element 500 operates in a "0" state, the switch circuit 516 is arranged to couple both of the reference circuits 512 and 514 to the output port P_OUT of the tri-level DAC element 500 (particularly, one output node of the tri-level DAC element 500), and the switch circuit 526 is arranged to couple both of the reference circuits 522 and 524 to the output port P_OUT of the tri-level DAC element 500 (particularly, another output node of the tri-level DAC element 500). Specifically, none of the reference circuits 512, 514, 522, and 524 is fully disconnected from the output port P_OUT of the tri-level DAC element 500 during the whole period in which the tri-level DAC element 500 operates in the "0" state. To achieve mismatch suppression, the mismatch between reference circuits 512, 522 and reference circuits 514, 524 is intentionally output by the tri-level DAC element 500 in the "0" state. Hence, the tri-level DAC element 500 is also called a pseudo tri-level DAC element. As shown in FIG. the tri-level DAC element 500 includes two DAC cells 502 and 504, each being a half of the single DAC cell 102 shown in FIG. 1. Hence, compared to the switch circuit 108 that is controlled according to the doubled sampling frequency 2*Fs, the switch circuits 516 and 526 of the tri-level DAC element 500 may be controlled according to the same sampling frequency Fs, if no cell swapping feature is implemented for further noise suppression. That is, in some embodiments, there is no need to divide one unit DAC symbol period into two phases. Hence, the period in which the tri-level DAC element 500 operates in the "0" state may not be divided into the aforementioned first phase PH1 and second phase PH2. However, this is for illustrative purposes only, and is not meant to be a limitation of the present invention. As will be detailed later, the switch circuits 516 and 526 of the tri-level DAC element 500 may be controlled according to the doubled sampling frequency 2*Fs, if the cell swapping feature is implemented for further noise suppression.

Figure 6:
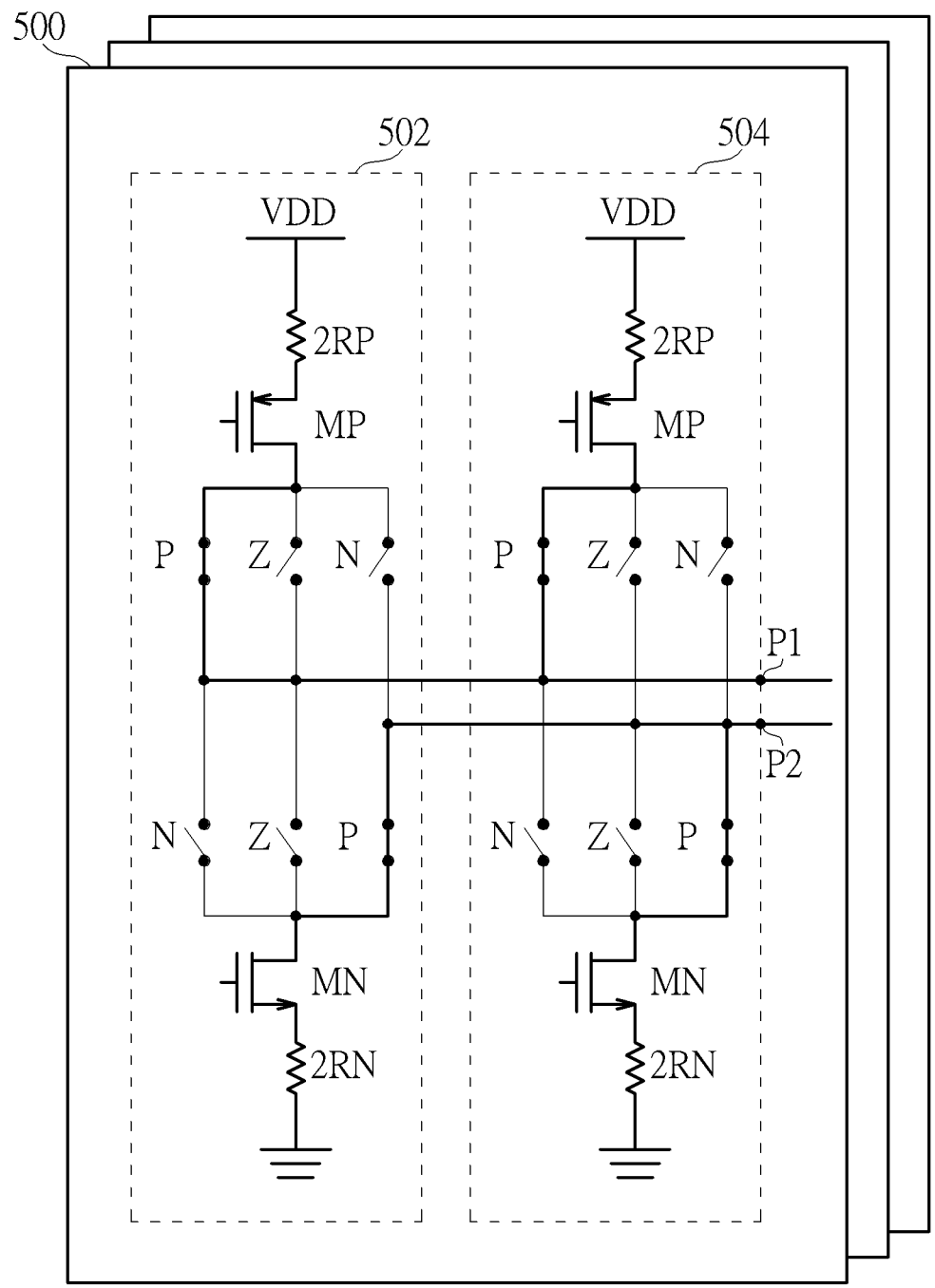
FIG. 6 is a diagram illustrating a configuration of the tri-level DAC element shown in FIG. 5 that operates in a "+1" state according to an embodiment of the present invention.
Figure 7:
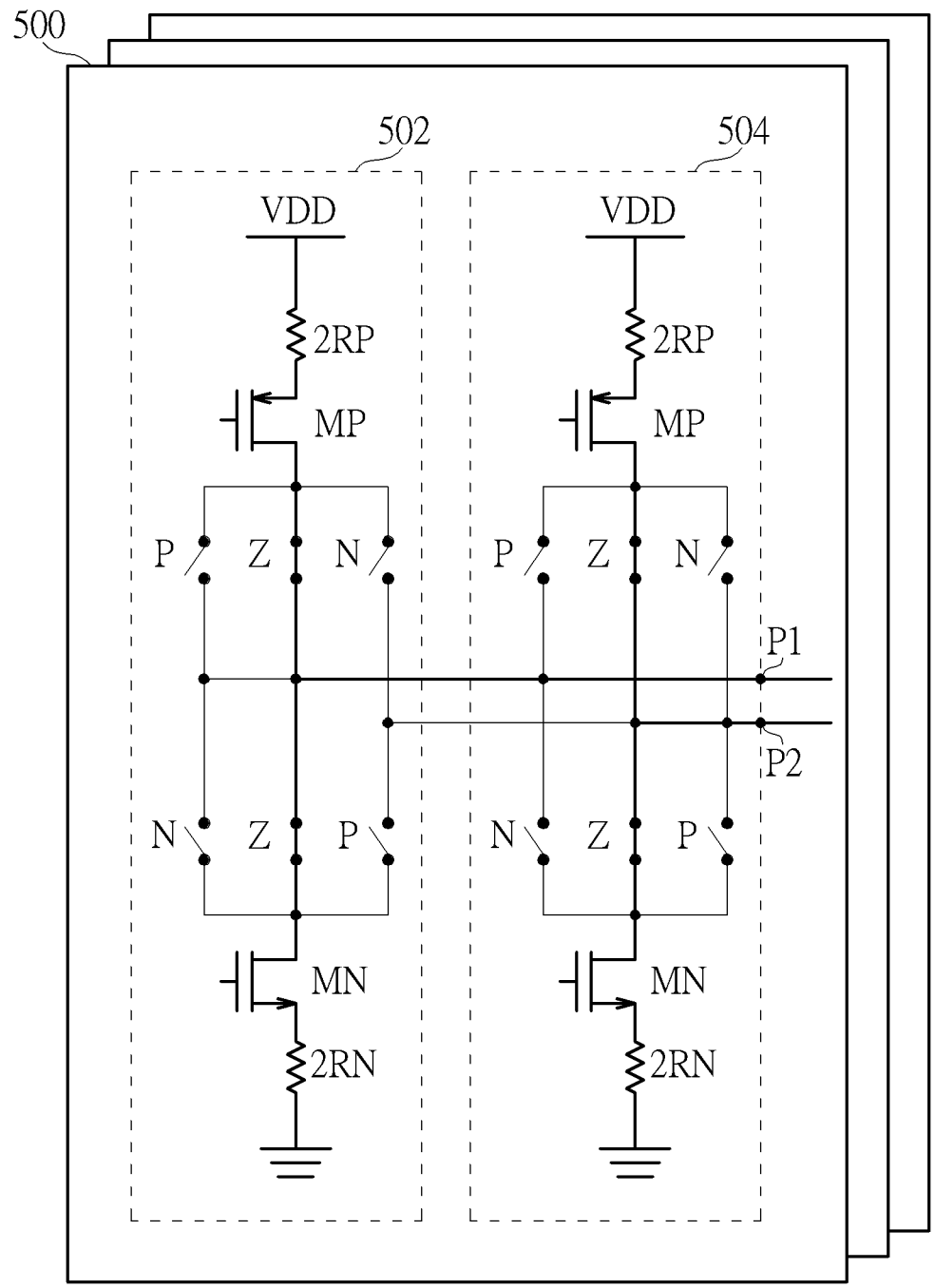
FIG. 7 is a diagram illustrating a configuration of the tri-level DAC element in FIG. 5 that operates in a "0" state according to an embodiment of the present invention.
Figure 8:
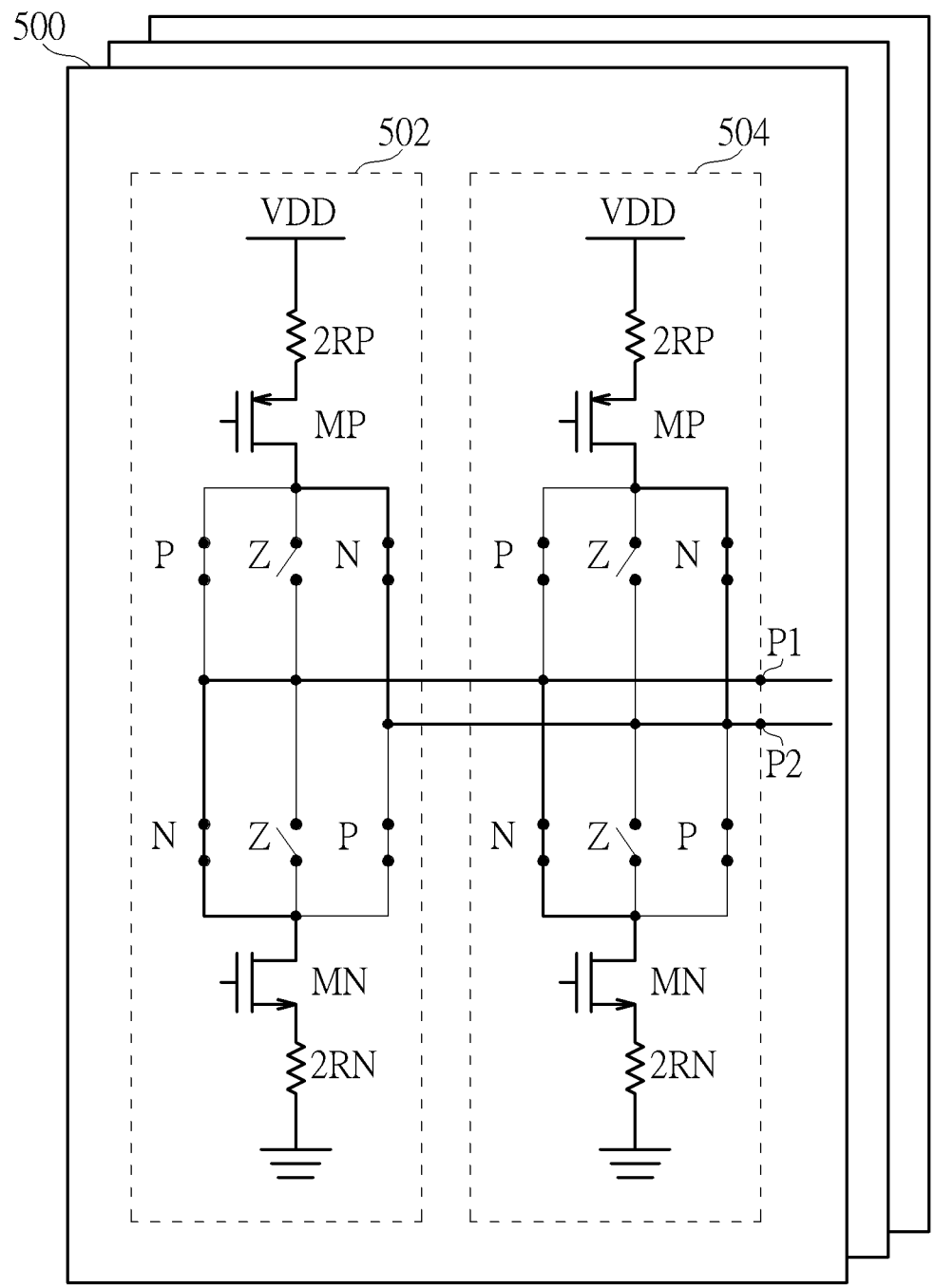
FIG. 8 is a diagram illustrating a configuration of the tri-level DAC element in FIG. 5 that operates in a "−1" state according to an embodiment of the present invention.

Please refer to FIGS. 6-8. FIG. 6 is a diagram illustrating a configuration of the tri-level DAC element 500 operating in a "+1" state according to an embodiment of the present invention. FIG. 7 is a diagram illustrating a configuration of the tri-level DAC element 500 operating in a "0" state according to an embodiment of the present invention. FIG. 8 is a diagram illustrating a configuration of the tri-level DAC element 500 operating in a "−1" state according to an embodiment of the present invention. Suppose that the reference circuit 512 is a PMOS based current source MP for generating the reference current $I_p/2$ as the reference signal $S_{REF\_1}'$, the reference circuit 522 is a PMOS based current source MP for generating the reference current $I_p/2$ as the reference signal $S_{REF\_3}$, the reference circuit 514 is an NMOS based current sink MN for generating the reference current $I_n/2$ as the reference signal $S_{REF\_2}'$, the reference circuit 524 is an NMOS based current sink MN for generating the reference current $I_n/2$ as the reference signal $S_{REF\_4}$, each of the switch circuits 516 and 526 includes a plurality of switches controlled by the control bits {P, Z, N} included in the control input S_IN that is received at the input port P_IN of the tri-level DAC element 500. In this embodiment, the output port P_OUT of the tri-level DAC element 500 includes two output nodes P1 and P2. For example, the output node P1 is coupled to the non-inverting input node (+) of the TIA 101, and the output node P2 is coupled to the inverting input node (−) of the TIA 101.

During a period in which the tri-level DAC cell 500 operates in the "+1" state in response to {P, Z, N}={1, 0, 0} as illustrated in FIG. 6, the switch circuit 516 is controlled to couple the reference circuit 512 to the output node P1, couple the reference circuit 514 to the output node P2, disconnect the reference circuit 514 from the output node P1, and disconnect the reference circuit 512 from the output node P2; and the switch circuit 526 is controlled to couple the reference circuit 522 to the output node P1, couple the reference circuit 524 to the output node P2, disconnect the reference circuit 524 from the output node P1, and disconnect the reference circuit 522 from the output node P2. When the output nodes P1 and P2 are connected to the TIA 101 shown in FIGS. 2-3, the positive output OUTP, the negative output OUTN, and the difference between the positive output OUTP and the negative output OUTN generated during a period in which the tri-level DAC element 500 operates in the "+1" state may be expressed using the aforementioned formulas (7), (8), and (9).

During a period in which the tri-level DAC cell 500 operates in the "0" state in response to {P, Z, N}={0, 1, 0} as illustrated in FIG. 7, the switch circuit 516 is controlled to couple both of the reference circuits 512 and 514 to the output node P1, disconnect both of the reference circuits 512 and 514 from the output node P2, couple both of the reference circuits 522 and 524 to the output node P2, and disconnect both of the reference circuits 522 and 524 from the output node P1. When the output nodes P1 and P2 are connected to the TIA 101 shown in FIGS. 2-3, the positive output OUTP, the negative output OUTN, and the difference between the positive output OUTP and the negative output OUTN generated during a period in which the tri-level DAC element 500 operates in the "0" state may be expressed using the aforementioned formulas (1), (2), and (3).

During a period in which the tri-level DAC cell 500 operates in the "−1" state in response to {P, Z, N}={0, 0, 1} as illustrated in FIG. 8, the switch circuit 516 is controlled to couple the reference circuit 512 to the output node P2, couple the reference circuit 514 to the output node P1, disconnect the reference circuit 514 from the output node P2, and disconnect the reference circuit 512 from the output node P1; and the switch circuit 526 is controlled to couple the reference circuit 522 to the output node P2, couple the reference circuit 524 to the output node P1, disconnect the reference circuit 524 from the output node P2, and disconnect the reference circuit 522 from the output node P1. When the output nodes P1 and P2 are connected to the TIA 101 shown in FIGS. 2-3, the positive output OUTP, the negative output OUTN, and the difference between the positive output OUTP and the negative output OUTN generated during a period in which the tri-level DAC element 500 operates in the "−1" state may be expressed using the aforementioned formulas (10), (11), and (12).

As can be seen from above formulas (3) and (6), the difference between the positive output OUTP and the negative output OUTN generated during a period (which is not divided into multiple phases) in which the tri-level DAC element 500 operates in the "0" state is the same as the difference between the positive output OUTP and the negative output OUTN generated during the period in which the typical DAC element operates in the "0" state. However, as can be seen from above formulas (1) and (2), each of the positive output OUTP and the negative output OUTN generated during the period (which is not divided into multiple phases) in which the tri-level DAC element 500 operates in the "0" state includes a mismatch term $$\left(\frac{I_p - I_n}{2}\right) \cdot R_F$$

contributed by the reference circuits 512, 514, 522, and 524. In this way, the linearity for both single-ended outputs OUTP and OUTN can be improved, as illustrated in FIG. 4. Since the mismatch between the reference circuits 512, 514, 522, and 524 (particularly, mismatch between reference signals $S_{REF\_1'}$, $S_{REF\_2'}$, $S_{REF\_3}$, and $S_{REF\_4}$, which is equal to mismatch between reference signals $S_{REF\_1}$ and $S_{REF\_2}$) is intentionally output by the tri-level DAC element 500 in the "0" state, there is no non-linearity for both single-ended outputs OUTP, OUTN and the differential output (OUTP−OUTN).

Figure 9:
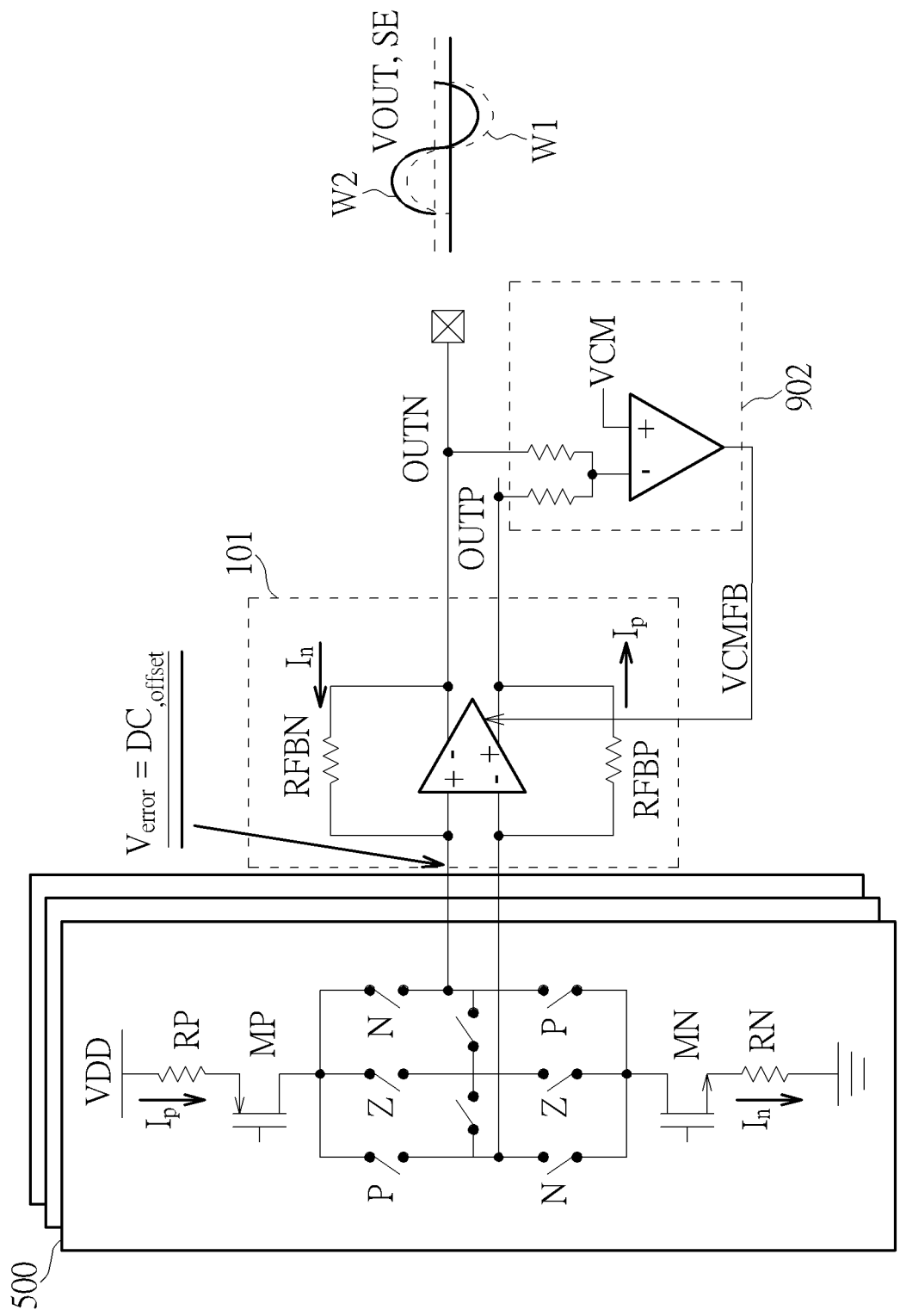
FIG. 9 is a diagram illustrating that an output port of the tri-level DAC element in FIG. 5 is connected to a transimpedance amplifier with a common-mode feedback circuit according to an embodiment of the present invention.

FIG. 9 is a diagram illustrating that the output port P_OUT of the tri-level DAC element 500 is connected to the TIA 101 with a CMFB circuit 902 according to an embodiment of the present invention. The voltage VOUT,SE of the single-ended output OUTP/OUTN has a voltage waveform W1 under an ideal case where there is no mismatch between $I_p$ and $I_n$, and has a voltage waveform W2 under an actual case where there is mismatch between $I_p$ and $I_n$. Due to there is no mismatch between $I_p$ and $I_n$, the CMFB gain for an I-to-V buffer can be relaxed, and the voltage fluctuation at the virtual ground of the TIA 101 can be reduced, which results in less drain modulation in the tri-level DAC element 500 (i.e., less intermodulation of DAC).

As shown in FIG. 7, the output port P1 is always coupled to the DAC cell 502 in the "0" state of the tri-level DAC element 500, and the output port P2 is always coupled to the DAC cell 504 in the "0" state of the tri-level DAC element 500. However, it is possible that mismatch may exist between the DAC cells 502 and 504. Since the tri-level DAC element 500 includes two DAC cells 502 and 504, each being a half of the single DAC cell 102 shown in FIG. 1, a chopping/swapping feature may be implemented for mismatch suppression of DAC cells 502 and 504. Specifically, by swapping two half-cells, the mismatch and correlated noise between these two DAC cells 502 and 504 can be shifted to a higher out-of-band frequency and then filtered out by a proper low-pass filter (not shown).

Figure 10:
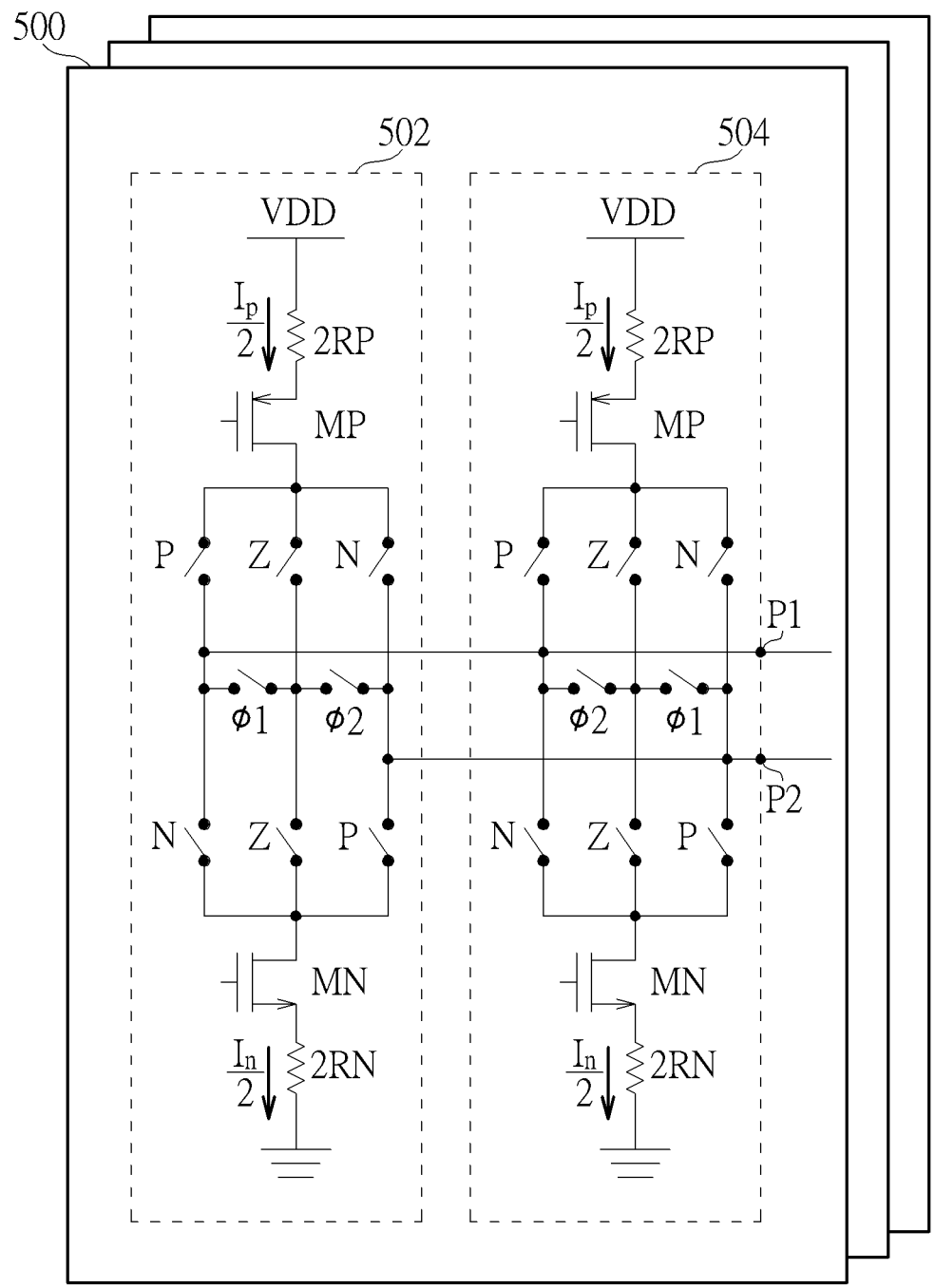
FIG. 10 is a diagram illustrating a tri-level DAC element with cell swapping according to an embodiment of the present invention.

FIG. 10 is a diagram illustrating the tri-level DAC element 500 with cell swapping according to an embodiment of the present invention. Suppose that the reference circuit 512 is a PMOS based current source MP for generating the reference current $I_p/2$ as the reference signal $S_{REF\_1'}$, the reference circuit 522 is a PMOS based current source MP for generating the reference current $I_p/2$ as the reference signal $S_{REF\_3}$, the reference circuit 514 is an NMOS based current sink MN for generating the reference current $I_n/2$ as the reference signal $S_{REF\_2'}$, and the reference circuit 524 is an NMOS based current sink MN for generating the reference current $I_n/2$ as the reference signal $S_{REF\_4}$. In this embodiment, each of the switch circuits 516 and 526 includes a plurality of switches controlled by the control bits {P, Z, N} included in the control input S_IN that is received at the input port P_IN of the tri-level DAC element 500, and further includes a plurality of switches controlled by different phases {ϕ1,ϕ2} in the "0" state. To achieve the objective of swapping DAC cells 502 and 504 in the same "0" state for shifting the mismatch and correlated noise to the higher out-of-band frequency, a doubled sampling frequency 2*Fs may be used to divide one unit DAC symbol period into a first phase ϕ1 and a second phase ϕ2. That is, the period in which the tri-level DAC element 500 operates in the "0" state is divided into the first phase ϕ1 and the second ϕ2. It should be noted that the order of the first phase ϕ1 and the second phase ϕ2 may be adjusted, depending upon actual design considerations. In one exemplary design, the first phase ϕ1 may precede the second phase ϕ2. In another exemplary design, the second phase ϕ2 may precede the first phase ϕ1.

Figure 11:
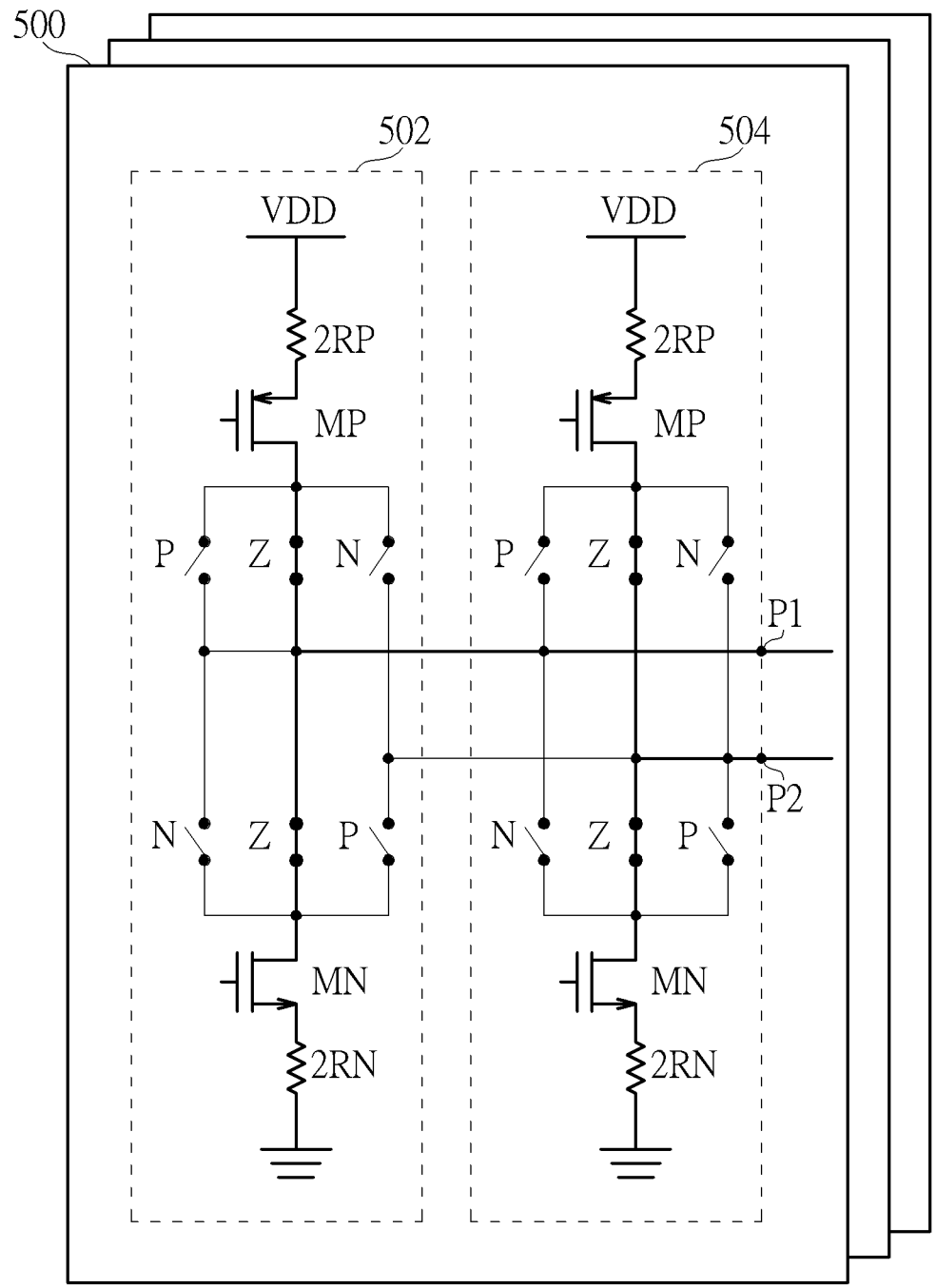
FIG. 11 is a diagram illustrating a configuration of the tri-level DAC element with cell swapping that operates under a first phase in a "0" state according to an embodiment of the present invention.
Figure 12:
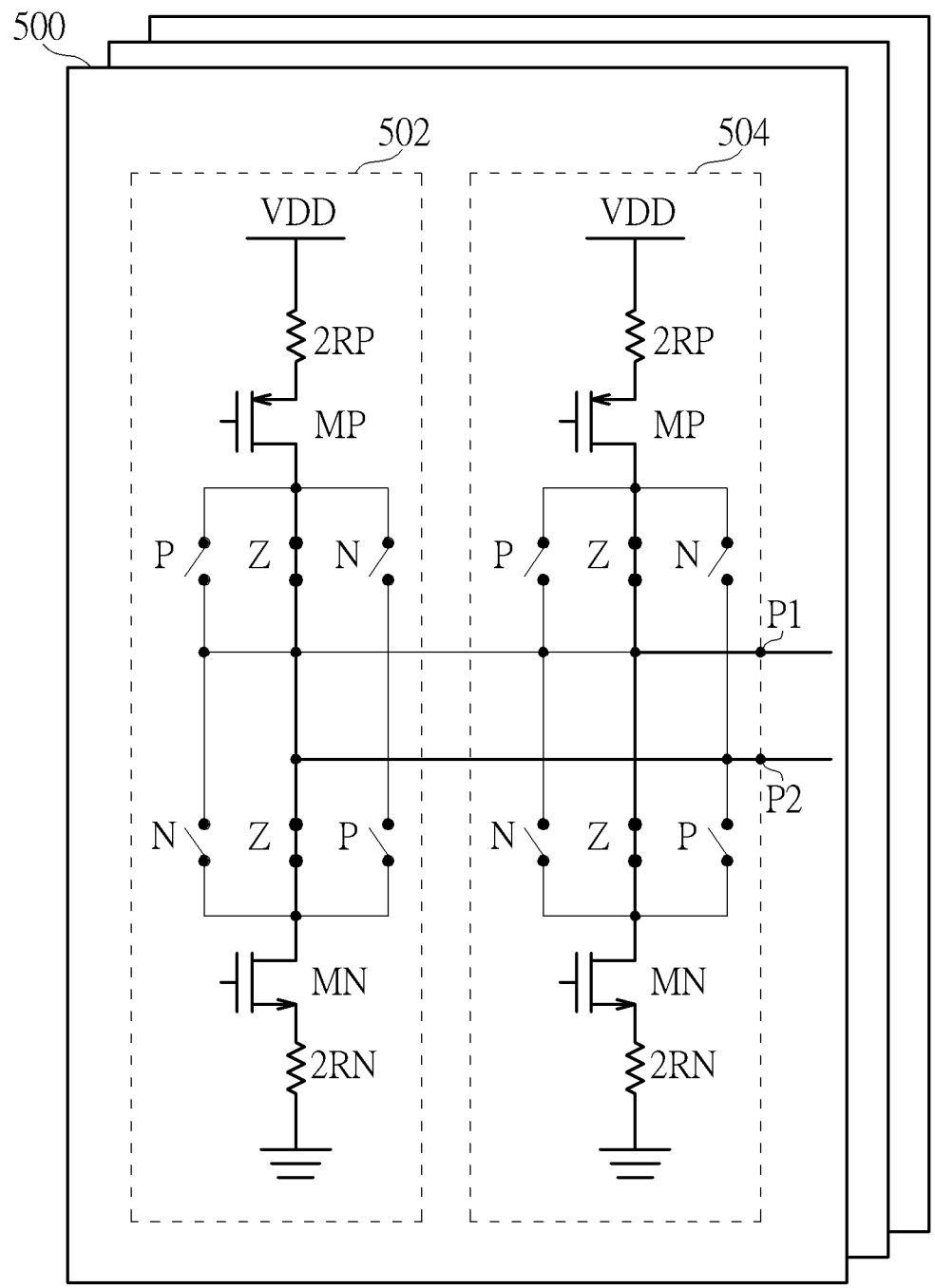
FIG. 12 is a diagram illustrating a configuration of the tri-level DAC element with cell swapping that operates under a second phase in a "0" state according to an embodiment of the present invention.

Please refer to FIG. 11 and FIG. 12. FIG. 11 is a diagram illustrating a configuration of the tri-level DAC element 500 with cell swapping that operates under the first phase ϕ1 in a "0" state according to an embodiment of the present invention. FIG. 12 is a diagram illustrating a configuration of the tri-level DAC element 500 with cell swapping that operates under the second phase ϕ2 in a "0" state according to an embodiment of the present invention. As shown in FIG. 11, when the tri-level DAC element 500 with cell swapping operates in the first phase ϕ1 in the "0" state, the switch circuit 516 is controlled to couple both of the reference circuits 512 and 514 of the DAC cell 502 to the output node P1, and disconnect both of the reference circuits 512 and 514 of the DAC cell 502 from the other output node P2; and the switch circuit 526 is controlled to couple both of the reference circuits 522 and 524 of the DAC cell 504 to the output node P2, and disconnect both of the reference circuits 522 and 524 of the DAC cell 504 from the other output node P1.

As shown in FIG. 12, when the tri-level DAC element 500 with cell swapping operates in the second phase ϕ2 in the "0" state, the switch circuit 516 is controlled to couple both of the reference circuits 512 and 514 of the DAC cell 502 to the output node P2, and disconnect both of the reference circuits 512 and 514 of the DAC cell 502 from the other output node P1; and the switch circuit 526 is controlled to couple both of the reference circuits 522 and 524 of the DAC cell 504 to the output node P1, and disconnect both of the reference circuits 522 and 524 of the DAC cell 504 from the other output node P2.

As shown in FIG. 11 and FIG. 12, The DAC cells 502 and 504 swap their connections to the output nodes P1 and P2 of the output port P_OUT of the tri-level DAC element 500 during a period in which the tri-level DAC element 500 operates in the "0" state. Specifically, the output node P1 is first connected to the reference circuits 512 and 514 of the DAC cell 502 in the first phase ϕ1 and then switched to the reference circuits 522 and 524 of the DAC cell 504 in the second phase ϕ2, and the output node P2 is first connected to the reference circuits 522 and 524 of the DAC cell 504 in the first phase ϕ1 and then switched to the reference circuits 512 and 514 of the DAC cell 502 in the second phase ϕ2. The tri-level DAC element 500 has a higher noise floor at the small signal compared to the typical tri-level DAC element. By swapping two half-cells in the tri-level DAC element 500, not only mismatch error between DAC cell 502 and 504, but low frequency DAC noise can also be suppressed.

Figure 13:
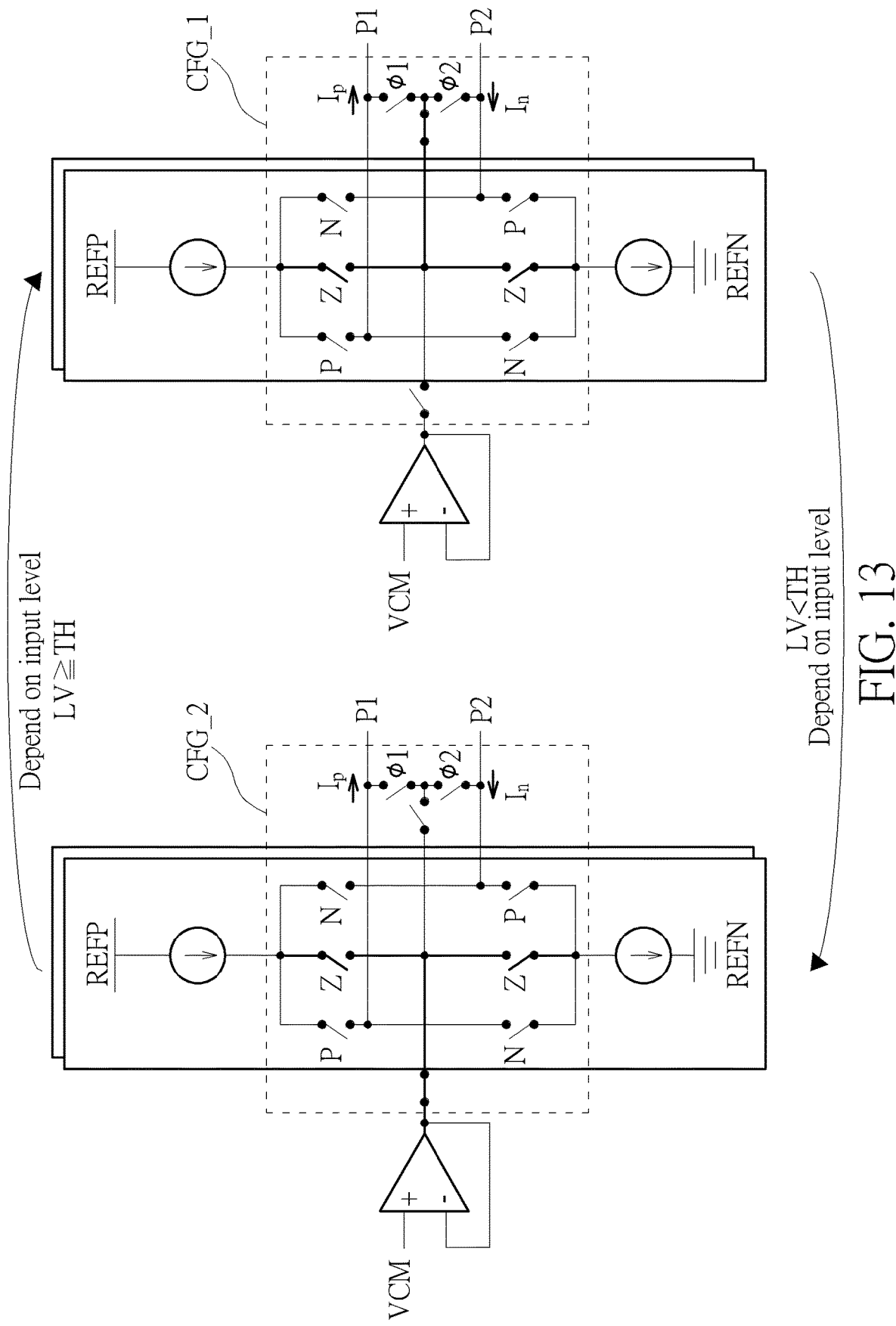
FIG. 13 is a diagram illustrating a tri-level DAC element that can be configured into a proposed high-linearity tri-level DAC element or a typical tri-level DAC element according to an embodiment of the present invention.

The proposed pseudo tri-level DAC element has a higher linearity at the large signal at the expense of a higher noise floor at the small signal compared to the typical tri-level DAC element. In some embodiments of the present invention, a tri-level DAC element may be configurable, thereby allowing configuration switching between a proposed pseudo tri-level DAC configuration and a typical tri-level DAC configuration for the "0" state according to the input signal level. FIG. 13 is a diagram illustrating a tri-level DAC element that can be configured into a proposed high-linearity tri-level DAC element or a typical tri-level DAC element according to an embodiment of the present invention. In this embodiment, the tri-level DAC element 100 (particularly, switch circuit 108 of tri-level DAC element 100) may be configurable to support different interconnection configurations CFG_1 and CFG_2 for the "0" state of the tri-level DAC element 100, where the switch circuit 108 enables the tri-level DAC element 100 to act as a high-linearity tri-level DAC element in the "0" state when the switch circuit 108 is configured to employ the interconnection configuration CFG_1, and the switch circuit 108 enables the tri-level DAC element 100 to act as a typical tri-level DAC element in the "0" state when the switch circuit 108 is configured to employ the interconnection configuration CFG_2. Specifically, the switch circuit 108 is arranged to enable one of the different interconnection configurations CFG_1 and CFG_2 according to the input signal level LV. When it is determined that the input signal is a small signal (e.g., input signal level LV is smaller than a pre-defined threshold TH), the switch circuit 108 is controlled to employ the interconnection configuration CFG_2 in the "0" state, thereby disconnecting both of the reference circuits 104 and 106 from the output port P_OUT during the whole period in which the tri-level DAC element 100 operates in the "0" state. When it is determined that the input signal is a large signal (e.g., input signal level LV is not smaller than the pre-defined threshold TH), the switch circuit 108 is controlled to employ the interconnection configuration CFG_1, thereby coupling at least one of the reference circuits 104 and 106 to the output port P_OUT during the period in which the tri-level DAC element 100 operates in the "0" state. It should be noted that the same concept may be applied to the tri-level DAC element 500 with/without cell swapping. Further description is omitted here for brevity.

Figure 14:
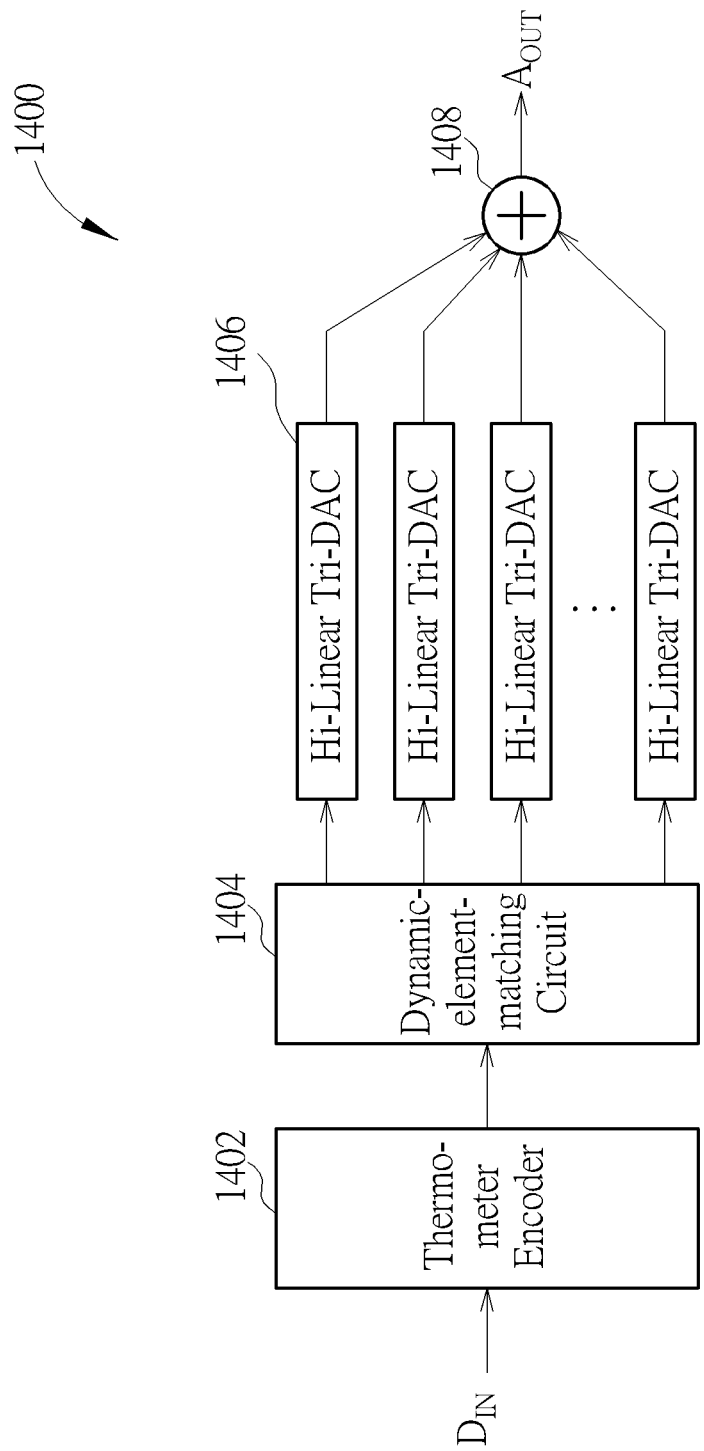
FIG. 14 is a diagram illustrating a decoder circuit according to an embodiment of the present invention.

The tri-level DC element 100/500 is a high-linearity tri-level DAC element that can be employed by a variety of applications. FIG. 14 is a diagram illustrating a decoder circuit according to an embodiment of the present invention. The decoder circuit 1400 includes a thermometer encoder 1402, a dynamic-element-matching (DEM) circuit 1404, a plurality of high-linearity tri-level DAC elements (labeled by "Hi-Linear Tri-DAC") 1406, and an analog summing circuit 1408. Each of the high-linearity tri-level DAC elements 1406 may be implemented using the tri-level DC element 100/500. With the help of the high-linearity tri-level DAC elements 1406, the decoder circuit 1400 is capable of generating a low THD analog output $A_{OUT}$ according to a digital input $D_{IN}$. It should be noted that the analog summing circuit 1408 may be implemented using a single-ended transimpedance amplifier, a differential transimpedance amplifier, or a pseudo-differential transimpedance amplifier, depending upon actual design considerations.

Figure 15:
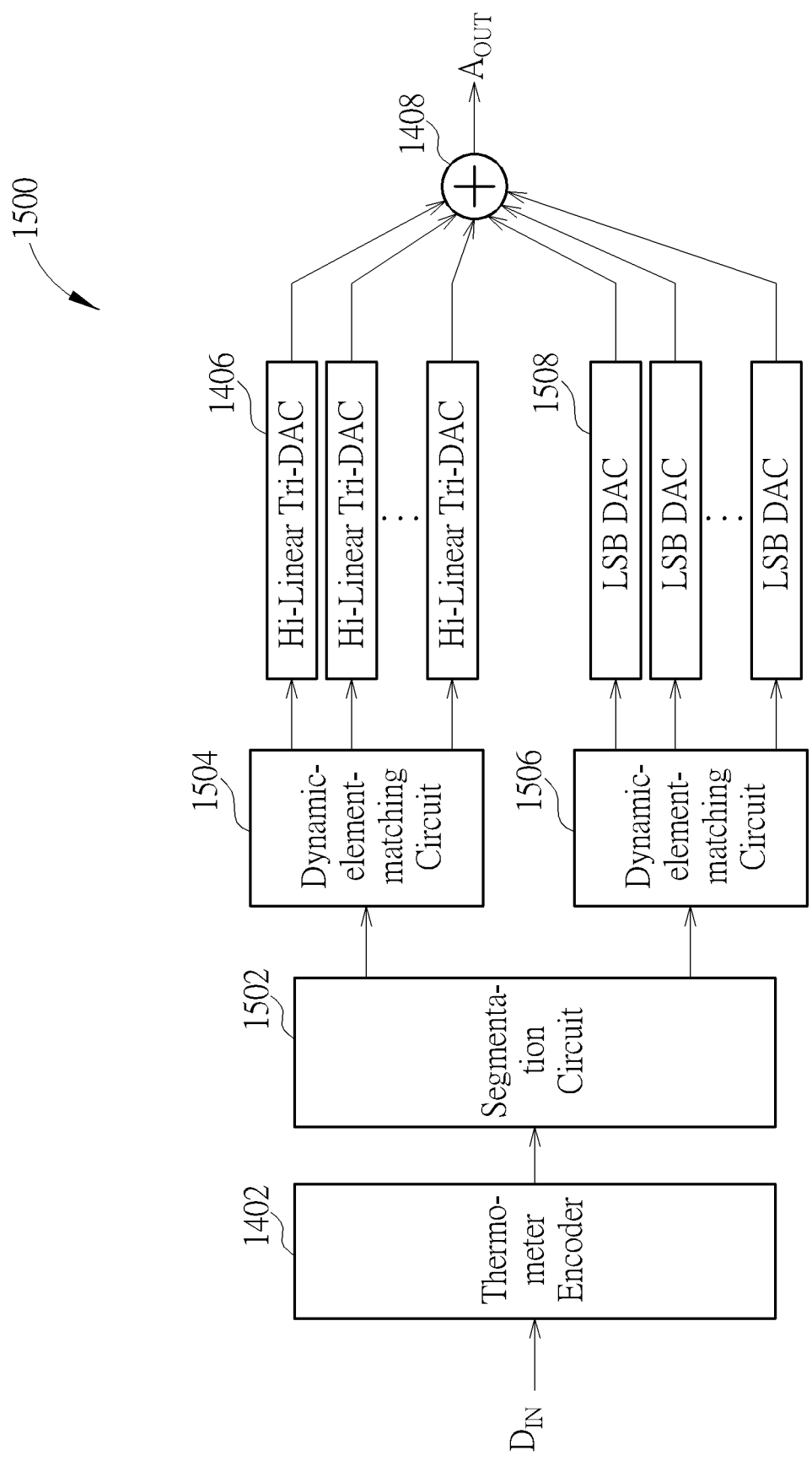
FIG. 15 is a diagram illustrating another decoder circuit according to an embodiment of the present invention.

FIG. 15 is a diagram illustrating another decoder circuit according to an embodiment of the present invention. The decoder circuit 1500 includes a segmentation circuit 1502, a plurality of DEM circuits 1504, 1506, a plurality of least significant bit (LSB) DAC elements (labeled by "LSB DAC") 1508, and the aforementioned thermometer encoder 1402, high-linearity tri-level DAC elements 1406, and analog summing circuit 1408. In this embodiment, the decoder circuit 1500 employs a segmented DAC having most significant bit (MSB) DAC elements (which are implemented by high-linearity tri-level DAC elements 1406) and LSB DAC elements 1508. With the help of the high-linearity tri-level DAC elements 1406, the decoder circuit 1500 is capable of generating a low THD analog output $A_{OUT}$ according to a digital input $D_{IN}$. It should be noted that the DAC element arrangement shown in FIG. 15 is for illustrative purposes only, and is not meant to be a limitation of the present invention. In practice, any segmented DAC having one or more DAC elements implemented using the proposed high-linearity tri-level DAC elements 1406 falls within the scope of the present invention.

Figure 16:
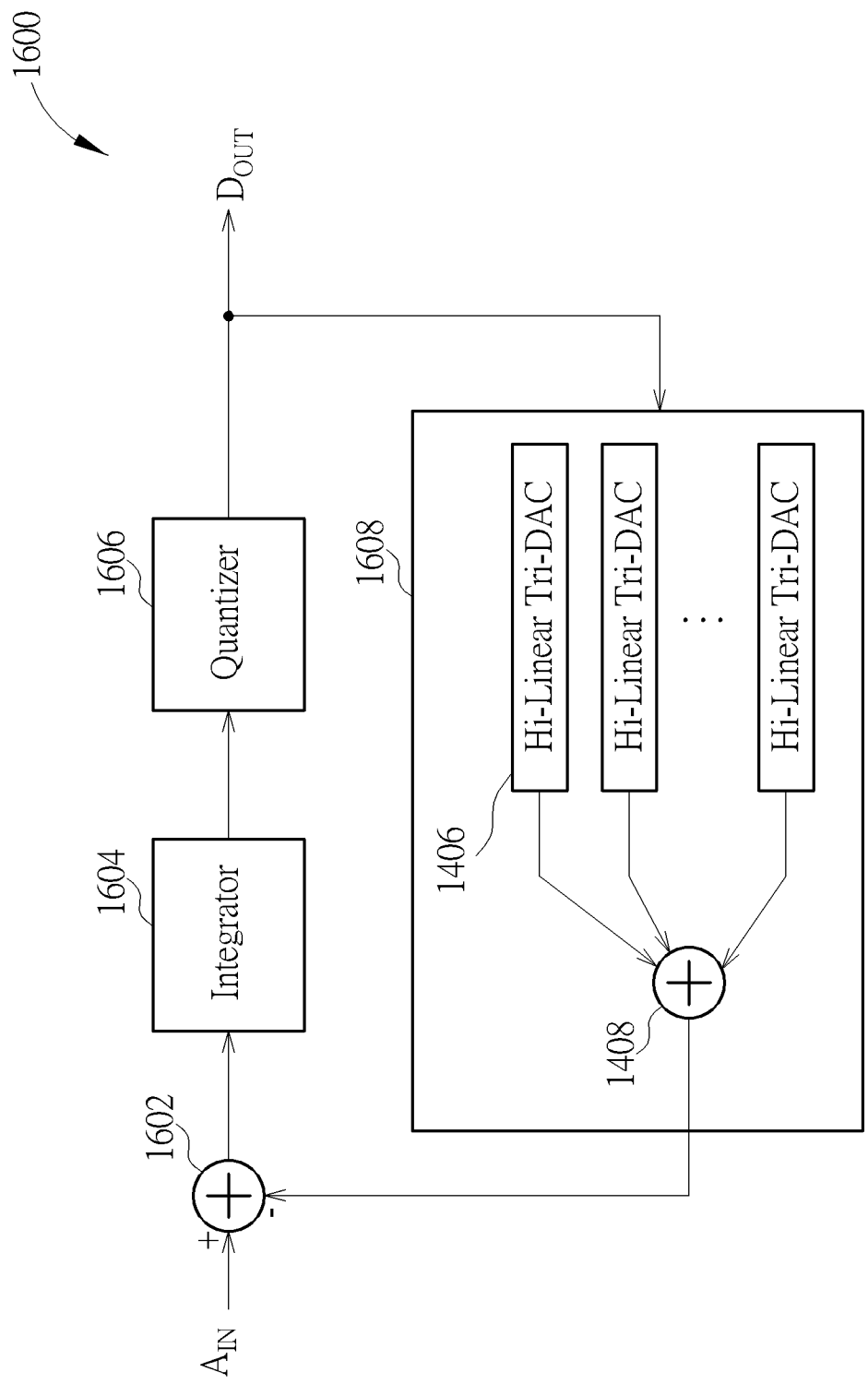
FIG. 16 is a diagram illustrating a sigma-delta modulator ADC circuit according to an embodiment of the present invention.

FIG. 16 is a diagram illustrating a sigma-delta modulator ADC circuit according to an embodiment of the present invention. The sigma-delta modulator ADC circuit 1600 includes an analog subtraction circuit 1602, an integrator 1604, a quantizer 1606, and a DAC 1608, where the DAC 1608 uses the aforementioned high-linearity tri-level DAC elements 1406 and analog summing circuit 1408. With the help of the high-linearity tri-level DAC elements 1406, the sigma-delta modulator ADC circuit 1600 is capable of generating a low THD digital $D_{OUT}$ according to an analog input $A_{IN}$.

It should be noted that the applications shown in FIGS. 14-16 are for illustrative purposes only, and are not meant to be limitations of the present invention. In practice, any application using the proposed pseudo tri-level DAC element (which is a high-linearity tri-level DAC element) falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A tri-level digital-to-analog converter (DAC) element comprising:
   a first DAC cell, comprising:
   a first reference circuit, arranged to provide a first reference signal;
   a second reference circuit, arranged to provide a second reference signal; and
   a first switch circuit, coupled to the first reference circuit and the second reference circuit, wherein the first switch circuit is arranged to receive a control input from an input port of the tri-level DAC element, and control interconnection between the first reference circuit, the second reference circuit, and an output port of the tri-level DAC element according to the control input, wherein the tri-level DAC element operates in one of three states that correspond to different levels in response to the control input; and during a period in which the tri-level DAC element operates in a "0" state of the three states, the first switch circuit is arranged to couple at least one of the first reference circuit and the second reference circuit to the output port of the tri-level DAC element.

2. The tri-level DAC element of claim 1, wherein the output port of the tri-level DAC element includes a first output node and a second output node; the period in which the tri-level DAC element operates in the "0" state is divided into a first phase and a second phase; when the tri-level DAC element operates in one of the first phase and the second phase, the first switch circuit is arranged to couple both of the first reference circuit and the second reference circuit to one of the first output node and the second output node; and when the tri-level DAC element operates in another of the first phase and the second phase, the first switch circuit is arranged to couple both of the first reference circuit and the second reference circuit to another of the first output node and the second output node.

3. The tri-level DAC element of claim 2, wherein when the tri-level DAC element operates in said one of the first phase and the second phase, the first switch circuit is arranged to disconnect both of the first reference circuit and the second reference circuit from said another of the first output node and the second output node.

4. The tri-level DAC element of claim 2, wherein when the tri-level DAC element operates in said another of the first phase and the second phase, the first switch circuit is arranged to disconnect both of the first reference circuit and the second reference circuit from said one of the first output node and the second output node.

5. The tri-level DAC element of claim 1, further comprising:
   a second DAC cell, comprising:
   a third reference circuit, arranged to provide a third reference signal;
   a fourth reference circuit, arranged to provide a fourth reference signal; and
   a second switch circuit, coupled to the third reference circuit and the fourth reference circuit, wherein the second switch circuit is arranged to receive the control input from the input port of the tri-level DAC element, and control interconnection between the third reference circuit, the fourth reference circuit, and the output port of the tri-level DAC element according to the control input, wherein during the period in which the tri-level DAC element operates in the "0" state, the second switch circuit is arranged to couple at least one of the third reference circuit and the fourth reference circuit to the output port of the tri-level DAC element.

6. The tri-level DAC element of claim 5, wherein the output port of the tri-level DAC element includes a first output node and a second output node; and during the period in which the tri-level DAC element operates in the "0" state, the first switch circuit is arranged to couple both of the first reference circuit and the second reference circuit to one of the first output node and the second output node, and the second switch circuit is arranged to couple both of the third reference circuit and the fourth reference circuit to another of the first output node and the second output node.

7. The tri-level DAC element of claim 6, wherein during the period in which the tri-level DAC element operates in the "0" state, the first switch circuit is arranged to disconnect both of the first reference circuit and the second reference circuit from said another of the first output node and the second output node.

8. The tri-level DAC element of claim 6, wherein during the period in which the tri-level DAC element operates in the "0" state, the second switch circuit is arranged to disconnect both of the third reference circuit and the fourth reference circuit from said one of the first output node and the second output node.

9. The tri-level DAC element of claim 5, wherein the output port of the tri-level DAC element includes a first output node and a second output node; the period in which the tri-level DAC element operates in the "0" state is divided into a first phase and a second phase; when the tri-level DAC element operates in one of the first phase and the second phase, the first switch circuit is arranged to couple both of the first reference circuit and the second reference circuit to one of the first output node and the second output node, and the second switch circuit is arranged to couple both of the third reference circuit and the fourth reference circuit to another of the first output node and the second output node; and when the tri-level DAC element operates in another of the first phase and the second phase, the first switch circuit is arranged to couple both of the first reference circuit and the second reference circuit to said another of the first output node and the second output node, and the second switch circuit is arranged to couple both of the third reference circuit and the fourth reference circuit to said one of the first output node and the second output node.

10. The tri-level DAC element of claim 9, wherein when the tri-level DAC element operates in said one of the first phase and the second phase, the first switch circuit is arranged to disconnect both of the first reference circuit and the second reference circuit to said another of the first output node and the second output node, and the second switch circuit is arranged to disconnect both of the third reference circuit and the fourth reference circuit to said one of the first output node and the second output node.

11. The tri-level DAC element of claim 9, wherein when the tri-level DAC element operates in said another of the first phase and the second phase, the first switch circuit is arranged to disconnect both of the first reference circuit and the second reference circuit from said one of the first output node and the second output node, and the second switch circuit is arranged to disconnect both of the third reference circuit and the fourth reference circuit to from said another of the first output node and the second output node.

12. The tri-level DAC element of claim 1, wherein the first switch circuit is configurable to support different interconnection configurations for the "0" state of the tri-level DAC element; and the first switch circuit is further arranged to enable one of the different interconnection configurations according to an input signal level.

13. The tri-level DAC element of claim 12, wherein the different interconnection configurations comprise a first interconnection configuration by which the first switch circuit couples said at least one of the first reference circuit and the second reference circuit to the output port of the tri-level DAC element.

14. The tri-level DAC element of claim 13, wherein the different interconnection configurations further comprise a second interconnection configuration by which the first switch circuit is arranged to disconnect both of the first reference circuit and the second reference circuit from the output port of the tri-level DAC element.

15. The tri-level DAC element of claim 1, wherein the tri-level DAC element is used in a decoder circuit.

16. The tri-level DAC element of claim 15, wherein the decoder circuit comprises a segmented DAC having a plurality of DAC elements, and one of the plurality of DAC elements is the tri-level DAC element.

17. The tri-level DAC element of claim 1, wherein the tri-level DAC element is used in a sigma-delta modulator analog-to-digital converter (ADC) circuit.

18. A digital-to-analog conversion method comprising:
receiving a control input from an input port of a tri-level DAC element, wherein the tri-level DAC element operates in one of three states that correspond to different levels in response to the control input, and comprises:
a first reference circuit, arranged to provide a first reference signal; and
a second reference circuit, arranged to provide a second reference signal; and
in response to the control input, controlling interconnection between the first reference circuit, the second reference circuit, and an output port of the tri-level DAC element, comprising:
during a period in which the tri-level DAC element operates in a "0" state of the three states, coupling at least one of the first reference circuit and the second reference circuit to the output port of the tri-level DAC element.

* * * * *